(12) United States Patent
Barabash et al.

(10) Patent No.: US 9,654,233 B2
(45) Date of Patent: May 16, 2017

(54) VSWR ESTIMATION USING SPECTRAL ANALYSIS TO SUPPRESS EXTERNAL INTERFERENCE

(71) Applicant: Nokia Solutions and Networks Oy, Espoo (FI)

(72) Inventors: Darrell Barabash, Grapevine, TX (US); Russell Morris, Keller, TX (US)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 14/781,945

(22) PCT Filed: Apr. 4, 2013

(86) PCT No.: PCT/US2013/035211
§ 371 (c)(1),
(2) Date: Oct. 2, 2015

(87) PCT Pub. No.: WO2014/163640
PCT Pub. Date: Oct. 9, 2014

(65) Prior Publication Data
US 2016/0020860 A1  Jan. 21, 2016

(51) Int. Cl.
*H04B 17/00* (2015.01)
*H04B 17/10* (2015.01)
*G01R 27/06* (2006.01)
*H04B 17/23* (2015.01)
*H04B 1/04* (2006.01)
*H04L 27/26* (2006.01)

(52) U.S. Cl.
CPC .......... *H04B 17/101* (2015.01); *G01R 27/06* (2013.01); *H04B 1/0458* (2013.01); *H04B 1/0475* (2013.01); *H04B 17/23* (2015.01); *H04L 27/265* (2013.01)

(58) Field of Classification Search
CPC ... H04W 24/00; H04B 17/103; H04B 17/101; H04B 1/0458; H04B 1/0483; H04B 1/0475
USPC ..... 455/129, 67.11, 67.14, 63.1, 278.1, 296; 340/10.1
See application file for complete search history.

(56) References Cited

U.S. PATENT DOCUMENTS

| | | | |
|---|---|---|---|
| 4,630,228 A * | 12/1986 | Tarczy-Hornoch | G01R 23/163 324/542 |
| 5,548,820 A | 8/1996 | Victorin | 455/67.4 |
| 6,305,851 B1 | 10/2001 | Stummer | 385/88 |
| 6,594,508 B1 | 7/2003 | Ketonen | 455/561 |

(Continued)

*Primary Examiner* — Sonny Trinh
(74) *Attorney, Agent, or Firm* — Harrington & Smith

(57) ABSTRACT

A method includes determining a total forward power using a frequency domain version of a forward signal transmitted over a cable/connector system to one or more antennas. The method includes determining a total reflected power using a frequency domain version of a reflected signal including a reflected version of the forward signal. The method also includes determining a condition of the cable/connector system using the total forward power and the total reflected power. The method may include determining an estimated reflection coefficient based on the total forward power and the total reflected power and associating the estimated reflection coefficient with the condition of the cable/connector system. Apparatus, program products, and software are also disclosed.

21 Claims, 8 Drawing Sheets

(56) References Cited

U.S. PATENT DOCUMENTS

| | | | | |
|---|---|---|---|---|
| 6,625,428 B1* | 9/2003 | Finnell | ............... | G01R 27/06 |
| | | | | 324/501 |
| 7,076,213 B2* | 7/2006 | Lee | ............... | H04B 17/0085 |
| | | | | 324/642 |
| 7,155,257 B2* | 12/2006 | Bird | ............... | H04B 3/36 |
| | | | | 455/14 |
| 8,229,690 B2* | 7/2012 | Schirrmacher | ...... | H04B 17/318 |
| | | | | 324/612 |
| 8,380,239 B2* | 2/2013 | Liu | ............... | H04B 17/102 |
| | | | | 455/115.1 |
| 8,902,111 B2* | 12/2014 | Liu | ............... | 343/703 |
| 9,225,441 B2* | 12/2015 | Strachan | ............... | G01R 31/086 |
| 9,385,820 B2* | 7/2016 | Barabash | ............... | H04B 1/0458 |
| 2002/0171411 A1 | 11/2002 | Nasman | ............... | 324/76.52 |
| 2012/0071123 A1 | 3/2012 | Jones et al. | ............... | 455/150.1 |
| 2012/0309322 A1* | 12/2012 | Xu | ............... | H04B 17/103 |
| | | | | 455/67.13 |
| 2015/0288461 A1* | 10/2015 | Barabash | ............... | H04B 1/0458 |
| | | | | 455/115.1 |

* cited by examiner

VSWR ESTIMATION USING SPECTRAL ANALYSIS TO SUPPRESS EXTERNAL INTERFERENCE

TECHNICAL FIELD

This invention relates generally to wireless transmissions and, more specifically, relates to antenna usage in wireless transmissions.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section. Abbreviations that may be found in the specification and/or the drawing figures are defined below at the end of the specification but prior to the claims.

In a wireless transmission system, a transmitter is coupled to an antenna through a cable/connector system. Assuming an ideal transmission system, there will be no reflected power in a reflected signal (or, put another way, there is no reflected signal). That is, the transmission power in the "forward" signal is all applied through the cable/connector system to the antenna. Real transmission systems, however, have some reflected power in a reflected signal due to, e.g., impedance mismatch somewhere in the cable/connector system or antenna.

Cellular operators need a way to monitor, in real-time, the condition of the antenna and its cable/connector system. The accepted indicator of this quality is the VSWR or, equivalently, the return loss. Return loss is the ratio of the forward and reflected powers, converted to dB. Most commonly, directional couplers, bridges or circulators are used to separate the two power signals (forward and reflected power signals) followed by detectors to quantify their respective amplitudes. While the forward signal tends to be quite pure, the reflected signal is returning from the antenna and may be accompanied by extraneous energy, e.g., "noise".

Recent advances in complex modulation, multiple carriers and especially co-siting can make the task of monitoring the condition of the antenna and its cable/connector system more difficult than in the past. As one example, the "noise" in the reflected signal may be due to other transmitters electrically combined with the desired transmitter or from co-sited transmitters coupling in through the antenna. Either way, a reflection detector will report more power than the reflection itself is producing, resulting in a lower return loss which may cause a false alarm. That is, since the return loss is a ratio of the forward and reflected powers, anything that erroneously increases the reported reflective power will decrease the return loss (assuming the forward power is stable), and an alarm can be reported due to the artificially reduced return loss.

It would be beneficial to improve monitoring the condition of the antenna and its cable/connector system.

SUMMARY

This section contains examples of possible implementations and is not meant to be limiting.

An exemplary embodiment is a method. The method includes determining a total forward power using a frequency domain version of a forward signal transmitted over a cable/connector system to one or more antennas. The method includes determining a total reflected power using a frequency domain version of a reflected signal comprising a reflected version of the forward signal. The method also includes determining a condition of the cable/connector system using the total forward power and the total reflected power. The method may include determining an estimated reflection coefficient based on the total forward power and the total reflected power and associating the estimated reflection coefficient with the condition of the cable/connector system.

In an additional exemplary embodiment, a computer program product is disclosed that comprises program code for executing the method according to the previous paragraph. Another exemplary embodiment is a computer program according to this paragraph, wherein the computer program is a computer program product comprising a computer-readable medium bearing computer program code embodied therein for use with a computer.

A further exemplary embodiment is an apparatus. The apparatus includes circuitry configured to determine a total forward power using a frequency domain version of a forward signal transmitted over a cable/connector system to one or more antennas. The apparatus further includes circuitry configured to determine a total reflected power using a frequency domain version of a reflected signal comprising a reflected version of the forward signal. The apparatus also includes circuitry configured to determine a condition of the cable/connector system using the total forward power and the total reflected power. The apparatus of this paragraph may be implemented as one or more integrated circuits. A base station may include the apparatus of this paragraph.

Another example is an apparatus. This apparatus includes: means for determining a total forward power using a frequency domain version of a forward signal transmitted over a cable/connector system to one or more antennas; means for determining a total reflected power using a frequency domain version of a reflected signal comprising a reflected version of the forward signal; and means for determining a condition of the cable/connector system using the total forward power and the total reflected power. One or more integrated circuits may comprise the apparatus of this paragraph. A base station may comprise the apparatus of this paragraph. A system may comprise the base station of this paragraph or the apparatus of this paragraph.

As yet another exemplary embodiment, an apparatus is disclosed. The apparatus includes one or more processors, and one or more memories including computer program code. The one or more memories and the computer program code configured, with the one or more processors, to cause the apparatus to perform at least the following: determining a total forward power using a frequency domain version of a forward signal transmitted over a cable/connector system to one or more antennas; determining a total reflected power using a frequency domain version of a reflected signal comprising a reflected version of the forward signal; and determining a condition of the cable/connector system using the total forward power and the total reflected power.

DETAILED DESCRIPTION OF THE DRAWINGS

Figure 1:
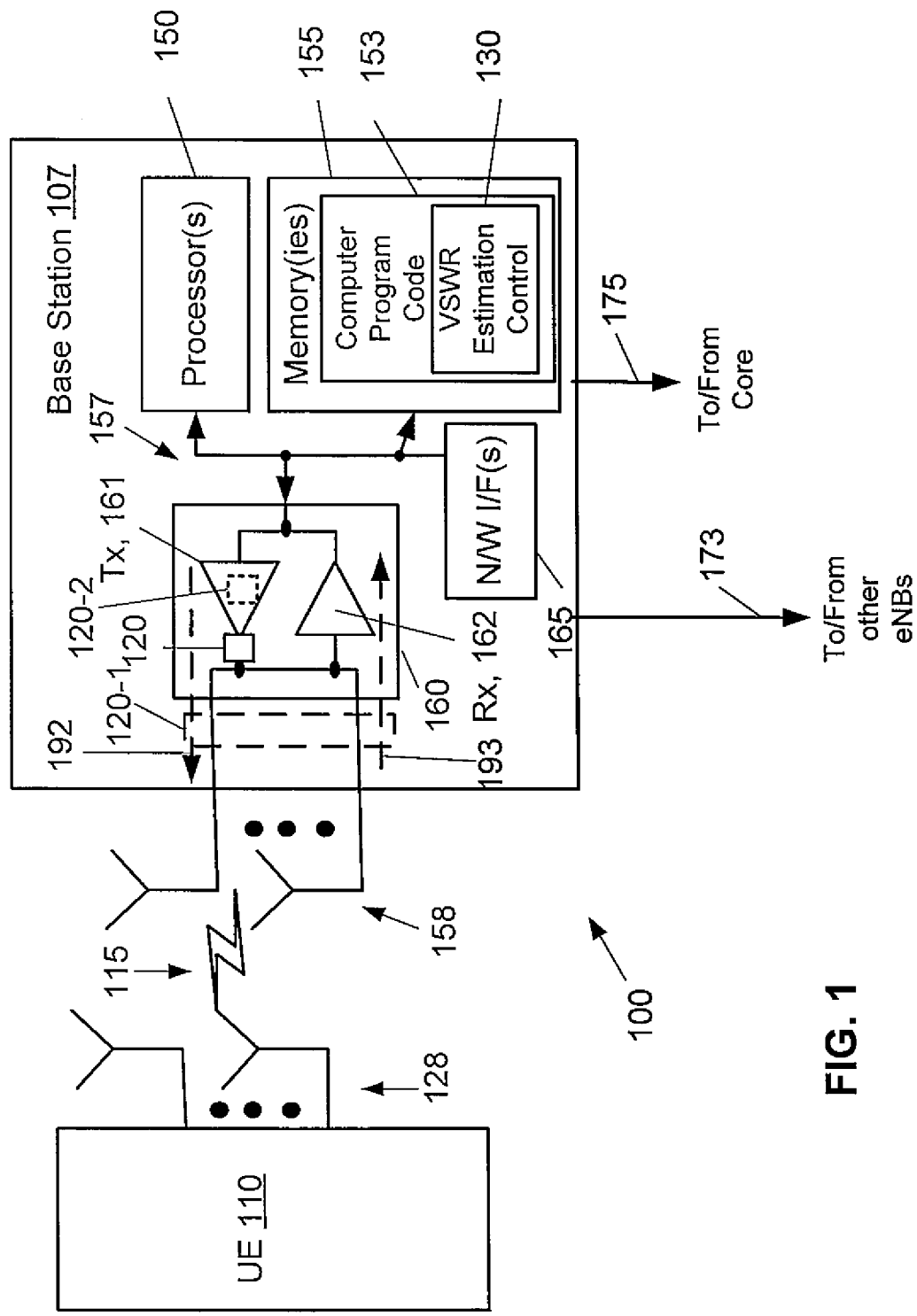
FIG. 1 illustrates an exemplary system in which the exemplary embodiments of the instant invention may be practiced.

Before proceeding with description of additional problems with conventional systems and how exemplary embodiments address these problems, reference is now made to FIG. 1, which illustrates an exemplary system in which the exemplary embodiments of the instant invention may be practiced. In FIG. 1, a user equipment (UE) 110 is in wireless communication with a wireless network 100 via a wireless link 115 with base station 107 (such as an eNB or NodeB), which is an LTE base station (in this example) providing access to and from the wireless network 100. The user equipment 110 includes one or more antennas 128.

The network 100 includes the base station 107. Although an LTE base station is used herein as an example, the exemplary embodiments are applicable to any wireless transmission system. The base station 107 includes one or more processors 150, one or more memories 155, one or more network interfaces (N/W I/F(s)) 165, and one or more transceivers 160 (each comprising a transmitter, Tx, 161 and a receiver, Rx, 162) interconnected through one or more buses 157. In the transmitter 161, a VSWR estimation apparatus 120 is used to perform VSWR estimation in accordance with exemplary embodiments of the instant invention. The location, as indicated by reference 120, of the VSWR estimation apparatus is merely exemplary. Portions 120-1 of the VSWR estimation apparatus 120 may be included after the Rx and Tx antenna paths are combined (as shown by reference 120-1), or portions 120-2 may be implemented in the transmitter 161. There are multiple locations in a transmission path 192 (and also in part of the reception path 193) where some or all of the VSWR estimation apparatus 120 may reside. The one or more transceivers 160 are connected to one or more antennas 158. The one or more memories 155 include computer program code 153, which in this example comprises VSWR estimation control functionality 130, which may partially or completely perform and/or control VSWR estimation. The one or more memories 155 and the computer program code 153 are configured to, with the one or more processors 150, cause the base station 107 to perform one or more of the operations as described herein. The VSWR estimation control functionality 130 may be implemented in the computer program code 153 (executed by the one or more processors 150), or implemented in hardware such as logic in an integrated circuit as described below, or as some combination of computer program code and hardware.

The one or more network interfaces 165 communicate over networks such as the networks 173, 175. The base station 107 may communicate with other base stations using, e.g., network 173. The network 173 may be wired or wireless or both and may implement, e.g., an X2 interface. The base station 107 may use the network 175 to communicate with a core portion of the wireless network 100.

The computer readable memory 155 may be of any type suitable to the local technical environment and may be implemented using any suitable data storage technology, such as semiconductor based memory devices, flash memory, magnetic memory devices and systems, optical memory devices and systems, fixed memory and removable memory. The processor(s) 150 may be of any type suitable to the local technical environment, and may include one or more of general purpose computers, special purpose computers, general or special purpose integrated circuits, microprocessors, digital signal processors (DSPs) and processors based on a multi-core processor architecture, as non-limiting examples.

Figure 2:
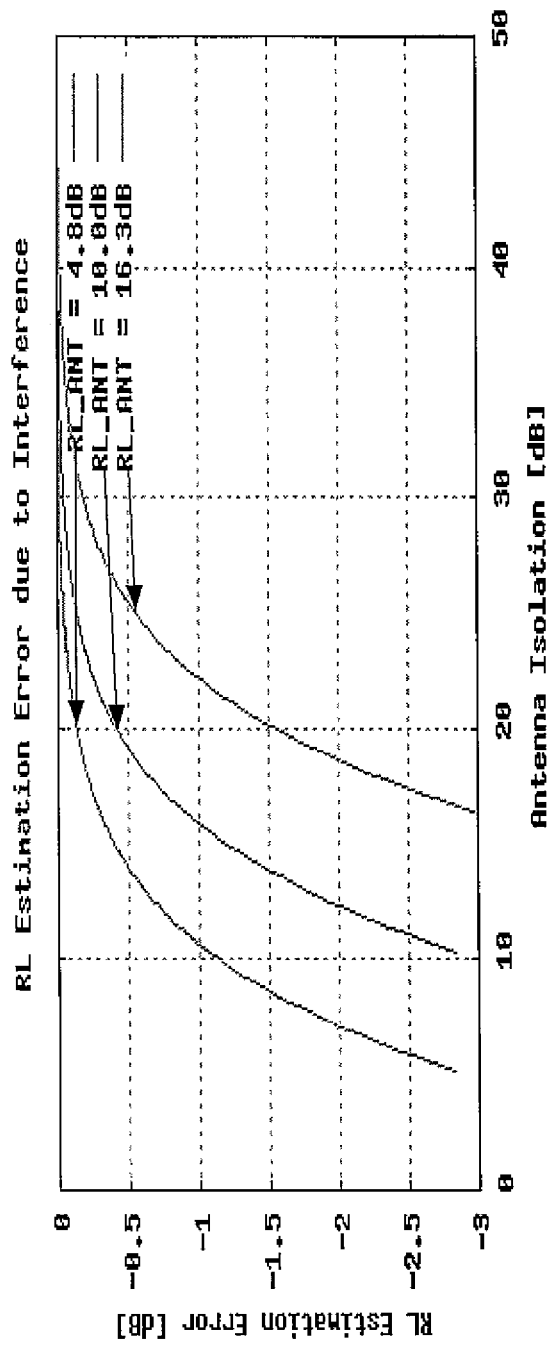
FIG. 2 is a chart of measurement error versus isolation.

As stated above, there could be noise in a reflected signal that causes a reflection detector to report more power than the reflection itself is producing, resulting in a lower return loss which may cause a false alarm. In order to obtain adequate accuracy, it is generally necessary to suppress the interfering signals by roughly 25 dB or more. But, depending on the tolerable error (see the RL, Return Loss, Estimation Error), the isolation could be more or less as shown in FIG. 2. The "RL_ANT" are return losses of the antenna system. The required isolation is usually obtained through some combination of power level restrictions, isolators, directional couplers/splitters and/or antenna placement. The exemplary embodiments disclosed herein are capable of minimizing or even eliminating the means normally taken to maintain adequate isolation. For instance, exemplary techniques disclosed herein provide discrimination between the reflections of the signal that are emanating from the desired transmitter versus interference that couples in from other sources (e.g., another transmitter co-sited with the transmitter TX 161 that transmits the original signal and receives the reflected signal).

By way of a brief and non-limiting introduction, in exemplary embodiments a forward signal is transmitted and a reflected signal occurs due to properties of the cable/connector system. The forward and reflected signals are (time) sampled using, e.g., an appropriate linear detector and the sampled information is converted to, e.g., voltage spectral representations using a Fourier transform or other technique. By multiplying the reflected voltage spectrum (e.g., as complex numbers) with the forward voltage spectrum (e.g., as complex numbers), spectral components not associated with the transmitted signal are suppressed or eliminated. The result of multiplying the reflected voltage spectrum with the forward voltage spectrum is referred to as a cross spectrum herein. The total power of this cross spectrum is then computed (using, e.g., Parseval's theorem) to determine the reflected power due to the transmitted signals only. By computing the ratio of this quantity to the total power of the forward signal (e.g., the square of the forward voltage spectrum), an estimated reflection coefficient is determined. The estimated reflection coefficient may be converted to return loss, VSWR or any other equivalent measurement.

Figure 3A:
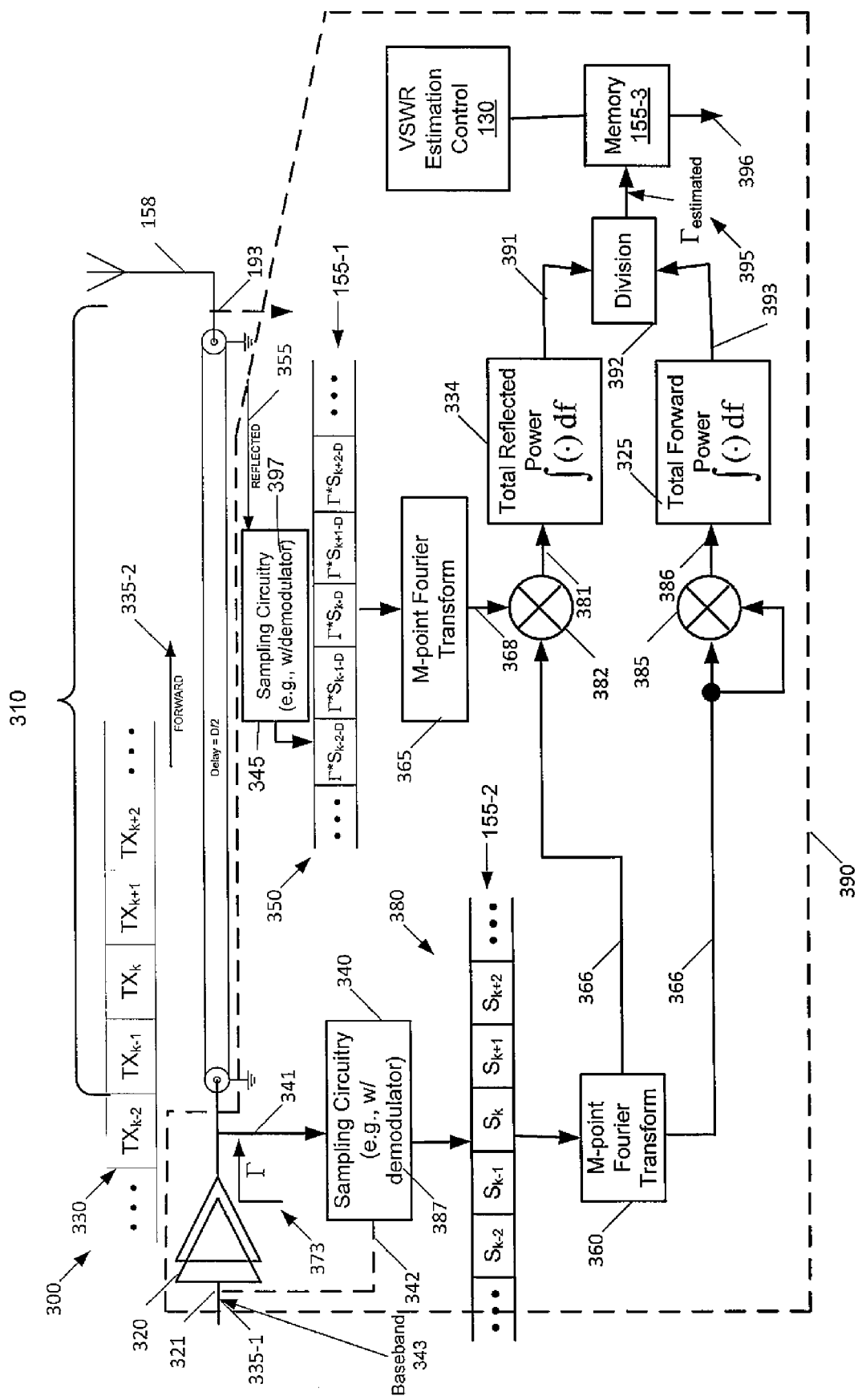
FIG. 3A is a block diagram of a portion of a transmitter including (a portion of) an exemplary VSWR apparatus.
Figure 3B:
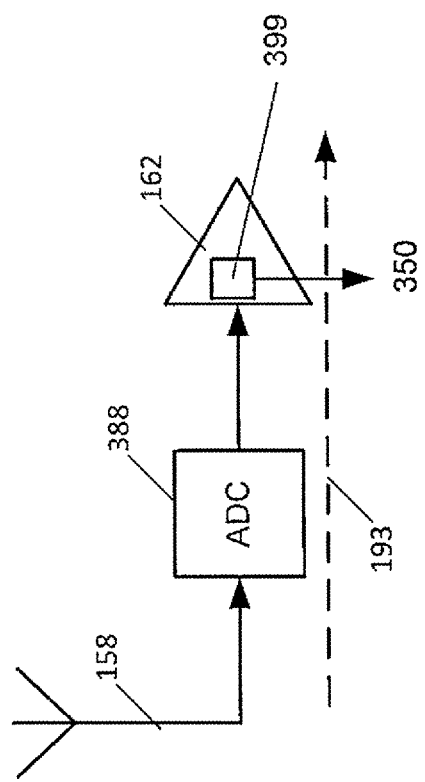
FIG. 3B is a block diagram of a portion of a reception path used as a portion of an exemplary VSWR apparatus.
Figure 4:
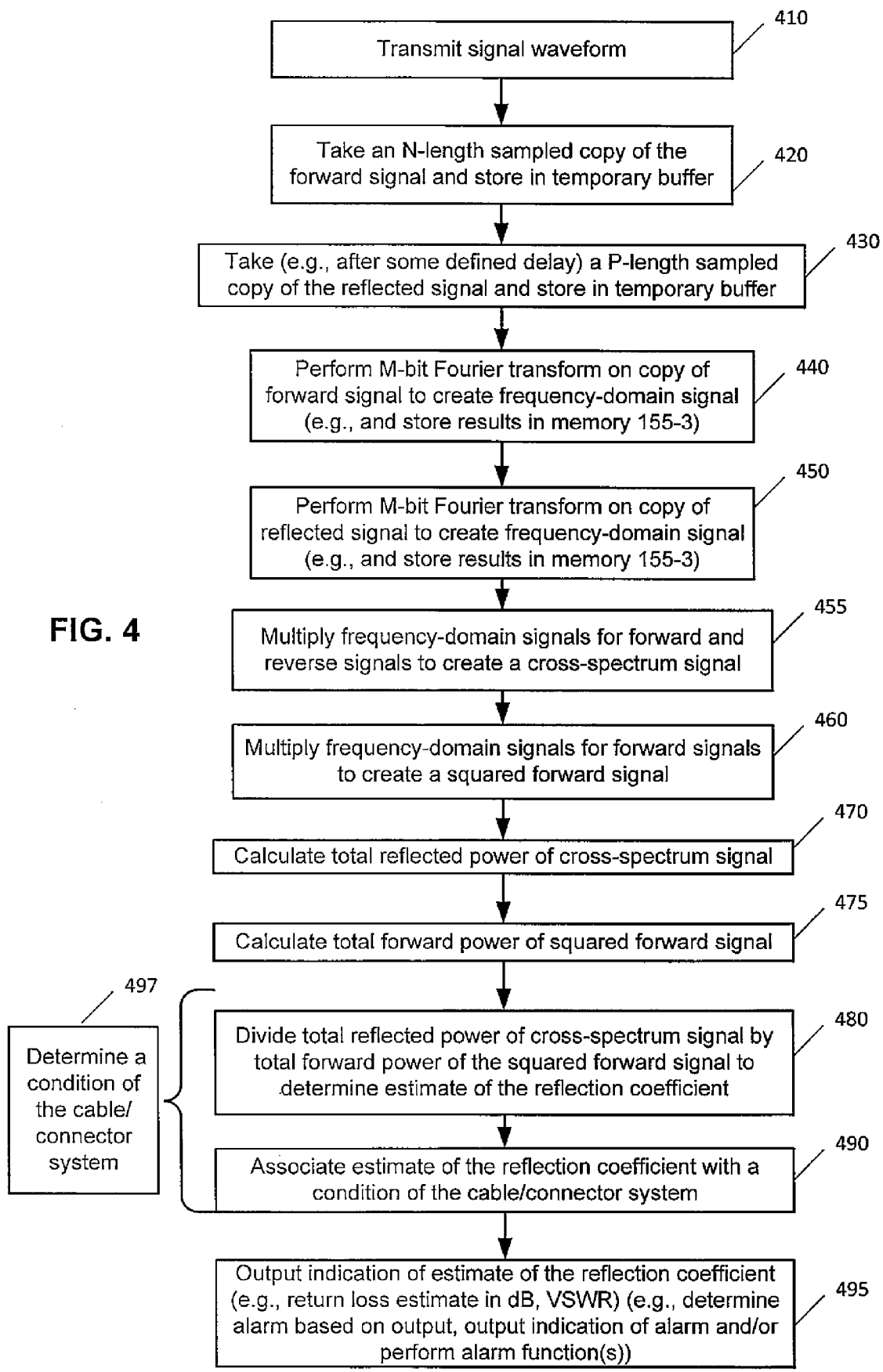
FIG. 4 is a block diagram of an exemplary logic flow diagram that illustrates the operation of an exemplary method, a result of execution of computer program instructions embodied on a computer readable memory, and/or functions performed by logic implemented in hardware, in accordance with exemplary embodiments of this invention.

Additional detail for certain exemplary embodiments is provided by reference to FIGS. 3 and 4. Turning to FIG. 3A, a block diagram is shown of a portion 300 of a transmitter 161, including an exemplary VSWR apparatus 120 (although the VSWR apparatus 120 may also be separate from the transmitter 161). It should be noted that FIG. 3A, for simplicity, concentrates on the transmission path and does not show the reception path (see FIG. 1 from the antenna(s) 158 to the receiver, Rx, 162). However, this not to be construed as limiting. The portion 300 includes one or more power amplifiers 320. The power amplifiers are coupled to a cable/connector system 310, which is coupled to the antenna 158. The delay caused by the cable/connector system 310 is D/2 in this simple example. The VSWR apparatus 120 includes in this example sampling circuitries 340 and 345, buffers 155-1 and 155-2, M-point Fourier transforms 360 and 365, multipliers 382 and 385, total reflected power calculators 334 and 325, divider 392, VSWR estimation control functionality 130, and memory 155-3. Illustratively, the one or more power amplifiers 320 and the VSWR estimation apparatus 120 are implemented in an integrated circuit (IC) 390, such as an application-specific integrated circuits (ASIC). The VSWR estimation control functionality 130 therefore may be implemented as logic in the IC 390. However, some or all of the VSWR estimation control functionality 130 may be implemented in computer program code 153 (e.g., stored as firmware/software in memory 155, see FIG. 1) and executed by a processor 150, e.g., formed as part of the IC 390 or separate from the IC 390.

It should be noted that although only one ASIC is shown, there may be multiple ASICs or other hardware elements. For instance, the sampling circuitry 340 could be implemented by one ASIC, the sampling circuitry 345 could be implemented by another ASIC, and the one or more memories 155 and VSWR estimation control 130 implemented by a third ASIC. Gate arrays or other programmed devices may also be used. Furthermore, aspects of the embodiments may be performed by hardware, software (executed by hardware), or some combination. This is really an implementation detail, trading off items like cost, space, VSWR reporting speed, and the like, but the general approaches herein are independent of this.

The example of FIG. 3A uses a sampling point 341 for at least the sampling of the forward signal 335-2. Thus, the indicated delay, D, is for the cable/connector system 310. However, this is merely exemplary, and the sampling of at least the forward signal 335 could occur at many different locations in the transmission path 192, e.g., at location 342, prior to the one or more power amplifiers 320 and as such can occur in the baseband 343. This is indicated by reference 335-1, which is a baseband version of the forward signal 335 that is transmitted. For this example, the sampling occurs without use of the demodulator 387. In this case, the transmission path 192 can start in the baseband 343 and conclude in the antenna(s) 158. Furthermore, in this case, the delay D can be quite large and include time delays for the power amplifier(s) 320, filters (not shown) if used, and other electronics.

The operation of the portion 300 of the transmitter 161 and of the VSWR apparatus 120 is described in relation to FIG. 3A and also in relation to FIG. 4. FIG. 4 is a block diagram of an exemplary logic flow diagram that illustrates the operation of an exemplary method, a result of execution of computer program instructions embodied on a computer readable memory, and/or functions performed by logic implemented in hardware, in accordance with exemplary embodiments.

In an exemplary embodiment, the transmitter 161, via the one or more power amplifiers 320, transmits (see block 410 of FIG. 4) an input signal (as a signal waveform that is a baseband version 335-1 of the forward RF signal 335-2) on input 321 through the cable/connector system 310 and through the antenna 158. A version of the amplified radio frequency signal waveform is shown as 330, which includes many symbols (in this example), a portion of which is shown as " ... $TX_{k-2}, TX_{k-1}, TX_k, TX_{k+1}, TX_{k+2}$ ... ", and a radio frequency version of the forward signal is illustrated by reference 335-2.

The forward RF signal 335-2 is sampled (block 420 of FIG. 4) at a particular sampling rate (e.g., in megasamples per second, Msps) by the sampling circuitry 340 at sampling point 314, e.g., after demodulation by the demodulator 387 in an example. The set 380 of samples includes in this example N samples, a portion of which is shown as " ... $S_{k-2}, S_{k-1}, S_k, S_{k+1}, S_{k+2}$ ... ", where each S is a symbol corresponding to a symbol TX in the amplified RF waveform 330. A fixed length (e.g., N-length) set 380 of samples of the transmitted forward RF signal 335-2 is taken and stored in, e.g., a temporary buffer 155-1 (block 420 of FIG. 4). Then, e.g., after some defined delay from the start of this buffering operation (e.g., the first of the N samples or some other reference point), another fixed length (e.g., P-length) set 350 of samples of the reflected waveform 355 is taken (block 430) by the sampling circuitry 345 at (e.g., the particular) sampling rate and is stored (block 430) in, e.g., another temporary buffer 155-2 (although it should be noted the two buffers 155-1 and 155-2 could be a single large buffer or part of memory 155-3). In one example, samples for set 350 are taken after demodulation by the demodulator 397. The set 350 of samples includes in this example P samples, a portion of which is shown as " ... $\Gamma S_{k-2-D}, \Gamma S_{k-1-D}, \Gamma S_{k-D}, \Gamma S_{k+1-D}, \Gamma S_{k+2-D}$ ... ", where $\Gamma$ is the reflection coefficient, each S is a symbol corresponding to a symbol TX in the amplified waveform 330, and the indicated delay, D, is 2*delay (twice the delay) for the cable/connector system 310. As illustrated by reference 373, the reflection coefficient F occurs looking outward from a beginning of the cable/connector system 310 toward the antenna 158. It is noted that the sampling circuitry 345 may occur before or after Rx and Tx paths are combined or at other locations in the Tx path. It is noted that typically P will be greater than or equal to N, although this is not a limitation. The results may be stored in memory 155-3.

The M-point Fourier transform 360 operates on the set 380 of samples of the forward signal 335-2 and creates a frequency domain signal 366 of that is a version of the forward signal 335-2. See block 440 of FIG. 4. The term "M-point" means that the block size of the input samples has M points. The Fourier transform will typically be a FFT or other type of DFT. As is known, a DFT is defined as follows:

$$X_k = \sum_{n=0}^{N-1} x_n e^{-j2\pi k \frac{n}{N}},$$

where $$k = 0, \ldots, N-1.$$

The DFT produces N outputs. The FFT is a faster technique of performing a DFT then simply performing the above equation.

The M-point Fourier transform 365 operates on the set 350 of samples of the reflected signal 355 and creates a frequency domain signal 368 that is a version of the reflected signal 355. See block 450 of FIG. 4. In block 455 of FIG. 4, the multiplier 382 multiplies frequency-domain signals for forward and reverse signals to create a cross-spectrum signal 381. As previously indicated, by multiplying the reflected voltage spectrum (e.g., as complex numbers in the frequency domain signal 368) with the forward voltage spectrum (e.g., as complex numbers in the frequency domain signal 366), spectral components not associated with the transmitted signal are suppressed or eliminated. In block 460, the multiplier 385 multiplies the frequency-domain signals 366 for forward signal 335-2 to create a squared forward signal 386.

In block 470, the reflected power calculator 334 calculates total reflected power 391 of the cross-spectrum signal 381 using Parseval's theorem, while in block 475, the reflected power calculator 325 calculates total forward power 393 of the squared forward signal 386 using Parseval's theorem. That is, each of the reflected power calculators 325, 334 calculates the total power in the forward signal 386 and cross-spectrum signal 381, respectively, in some bandwidth dictated by the parameters used by the FFT (in a corresponding one of the M-point Fourier transforms 360, 365). The reflected power calculator 334 produces an estimate of reflected power based on the power of the cross-spectrum in cross-spectrum signal 381. The specific bandwidth scaling factor does not actually matter because this factor is the same for both paths and therefore cancels out in the subsequent division.

In block 480, the divider 392 divides the total reflected power 392 by the total forward power 393 to produce the estimate of the reflection coefficient ($\Gamma_{estimated}$) 395. In block 490, the VSWR estimation control functionality 130 (e.g., or the base station 107, e.g., under control of the one or more processors 150 in response to execution of computer program code 153) associates the estimate of the reflection coefficient with a condition of the cable/connector system. A typical scenario is that an initial transmission or set of transmissions is used to set an appropriate estimate of the reflection coefficient 395 (or a range thereof). That is, for the condition of a properly functioning cable/connector system 310, the initial estimate of the reflection coefficient 395 (or range thereof) is/are taken and stored. For future transmissions, any estimate of the reflection coefficient 395 that is not within this initial estimate of the reflection coefficient 395 (or range thereof) and some threshold beyond the estimate (or range) indicates the condition of the cable/connector system 310 has deteriorated. In block 490, the estimate of the reflection coefficient 395 may be stored, e.g., in memory 155-3.

As indicated by block 497, the total forward power and the total reflected power may be used to determine a condition of the cable/connector system. Typically, blocks 480 and 490, described above, would be used for this determination. However, other techniques are possible. Another possibility is if the power samples were actually in the log domain (e.g., as sampled by a log sampler) rather than in the linear domain, then the division would become a difference instead.

It is further noted that the sampling rates used by sampling circuitries 420, 430 may be different. The different sampling rates would change the shapes of the two spectrums (e.g., in signals 366, 368, respectively), but the cross-spectrum in cross-spectrum signal 381 should still be suitable for use.

An indication of estimate of the reflection coefficient 395 may be subsequently output as indicated by reference 396 and by block 495. The estimated reflection coefficient 395 may be converted to return loss, VSWR or any other equivalent measurement.

As also indicated by block 495, an alarm may be determined based on the output 396, and/or an indication of alarm may be output based on the output 396 and/or alarm function(s) may be performed based on the output 396. For instance, if the estimate of the reflection coefficient ($\Gamma_{estimated}$) 395 suddenly were to increase, an indication of an alarm could be output, and an alarm function could be performed. Alarm functions are, in an exemplary embodiment, operations that would be used to "filter" alarm conditions and might include something such as a requirement for, e.g., five successive alarms in succession before taking action or, e.g., 10 alarms in a 10 minute period before taking action, and the like. Note that the operations in this paragraph would typically be performed by the base station, using the estimate of the reflection coefficient ($\Gamma_{estimated}$) 395 and, e.g., under control of the one or more processors 153 in response to execution of the computer program code 153. However, this is not a limitation.

In an example, the VSWR estimation control functionality 130 may cause the operations in blocks 420-490 to occur. In particular, the VSWR estimation control functionality 130 may cause some or all of the elements 340, 345, 360, 365, 382, 385, 334, 325, and 395 to perform their corresponding operations. Still other embodiments are possible, and the examples presented here should not be construed as being limiting. For instance, the base station 107 may perform some operations, such as those performed by blocks 490 and 495 as examples.

It is noted that the sampling circuitry 345 may occur before or after Rx and Tx paths are combined or at other locations in the Tx path. In particular, one possibility is shown in FIG. 3B, which shows a block diagram of a portion of a reception path 193 (also illustrated in FIG. 3A) used as a portion of an exemplary VSWR apparatus. In this example the portion includes an ADC (analog-to-digital converter 388) and part of the receiver 162, including at least a demodulator 399, which produces the set 350 of samples. It is noted that typically P will be greater than or equal to M, although this is not a limitation.

One possible simplification is by using only the magnitude of the spectrum and a scalar multiplication. For instance, multipliers 382 and 385 in blocks 455 and 460, respectively, would perform scalar multiplication instead of complex-valued multiplication. In this case, the technique is independent of reflection phase or delays. On the other hand, the absence of this reflection phase or delays information removes the ability to readily determine the position of the reflection and limit the rejection of co-channel interference.

Either of the complex or scalar embodiment will suppress signal components that are not present in both signals, including aliasing products. As such, Nyquist sampling is not strictly required especially if the two signals (forward and reflected) have such products at different frequencies. With careful selection of sample rates and bandwidths, this can result in further simplification. For instance, imagine a system with different sampling rates. After the FFT operation and taking the necessary frequency scaling into consideration, the "actual" signals will be found at the same frequencies but alias components will generally be different. The cross spectrum will still result in the actual signals being present but the alias components could be suppressed due to the other spectrum having a small magnitude at the alias frequency, and vice versa.

Figure 5:
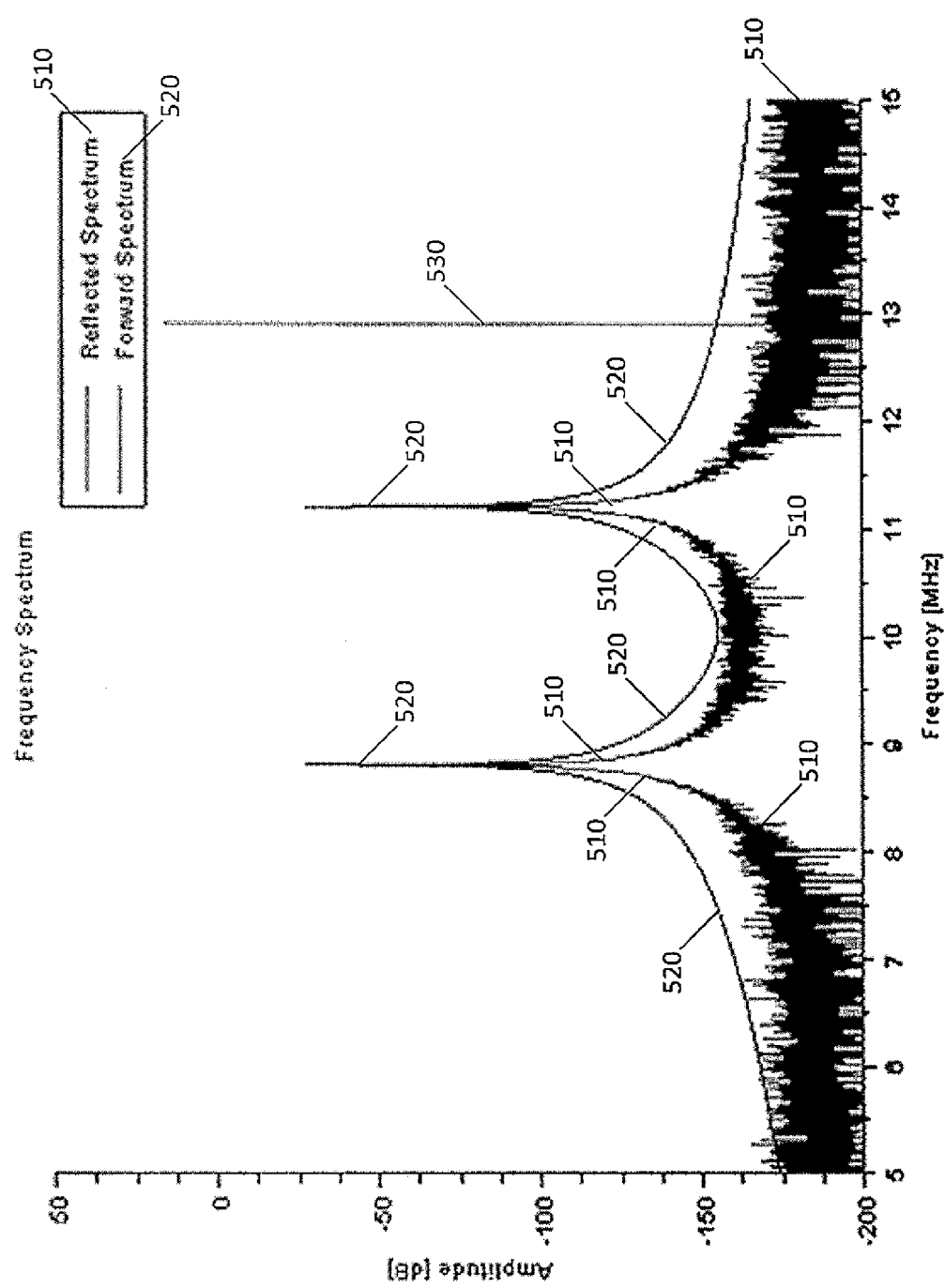
FIG. 5 is a frequency spectrum chart showing frequency spectra of forward and reflected signals with interference.

As a demonstration of the capabilities of an exemplary embodiment, consider the following. First, transmit two CW carriers at equal power into an antenna load that has a 20 dB return loss. FIG. 5 is a frequency spectrum chart showing frequency spectrum 520 of a forward signal and a frequency spectrum 510 of a reflected signal with interference. It can be seen that the interference (illustrated by reference 530) is about 60 dB higher than the desired reflection signals and would dominate any measurement using non-discriminating techniques. In particular, the interference peaks at about +20 dB, but the highest value for the reflected spectrum 510 is at about −40 dB. However, application of an exemplary cross spectrum technique such as that described with respect to FIGS. 3 and 4 can suppress the interference by a significant amount as illustrated in FIG. 6.

Figure 6:
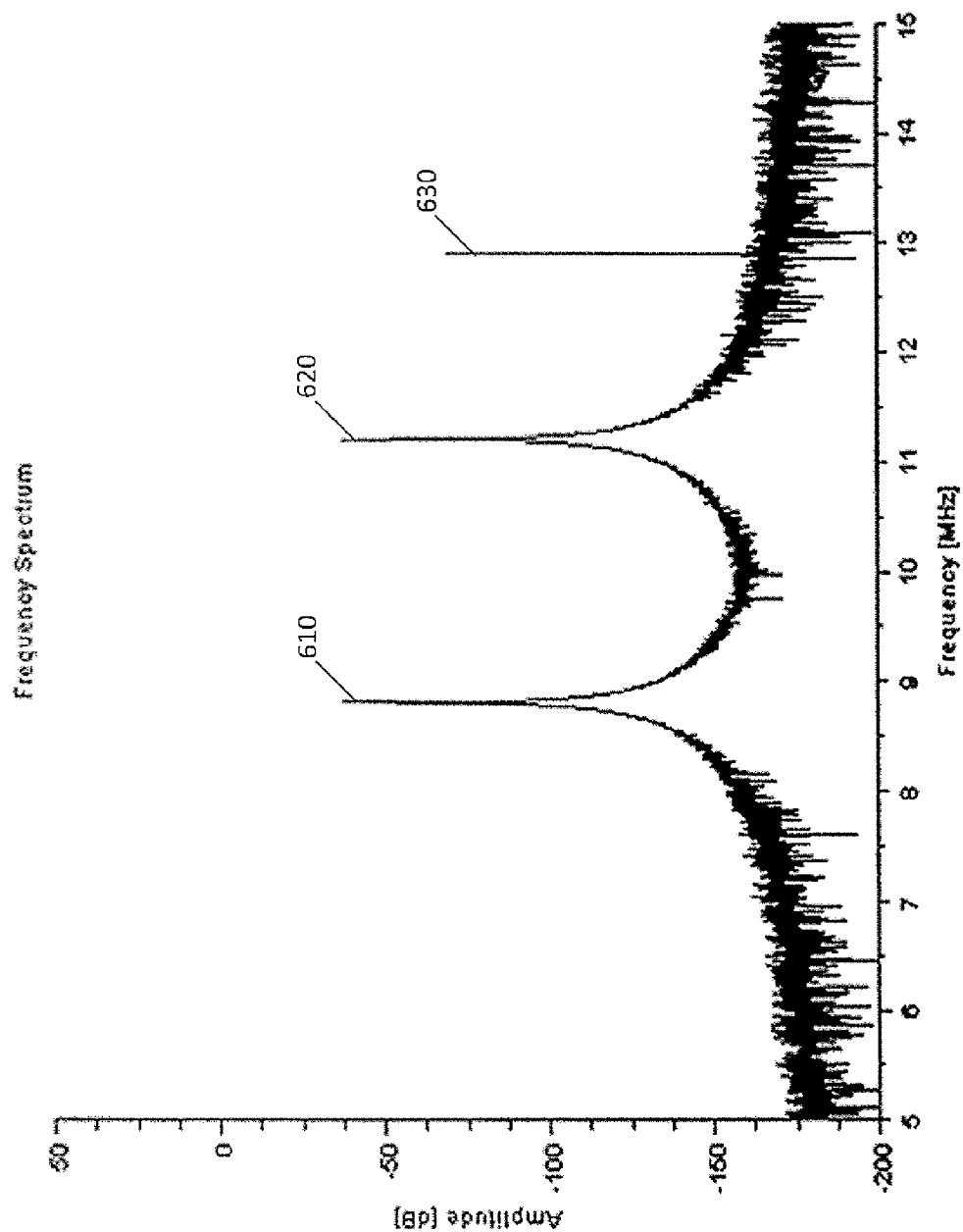
FIG. 6 is a frequency spectrum chart showing frequency spectrum of a cross-spectrum signal, including interference, after cross-spectrum operation.

FIG. 6 is a frequency spectrum chart showing frequency spectrum of a cross-spectrum signal, including interference, after cross-spectrum operation. Specifically, peaks 610 and 620 correspond to the desired signal, while peak 630, which corresponds to the noise, is now lower than the desired signal by about 30 dB. It should be noted that the amount of suppression is limited by the forward signal FFT noise floor and its resolution. Thus, the exemplary techniques will provide some level of discrimination for all but perfect co-channel carrier components.

Figure 7:
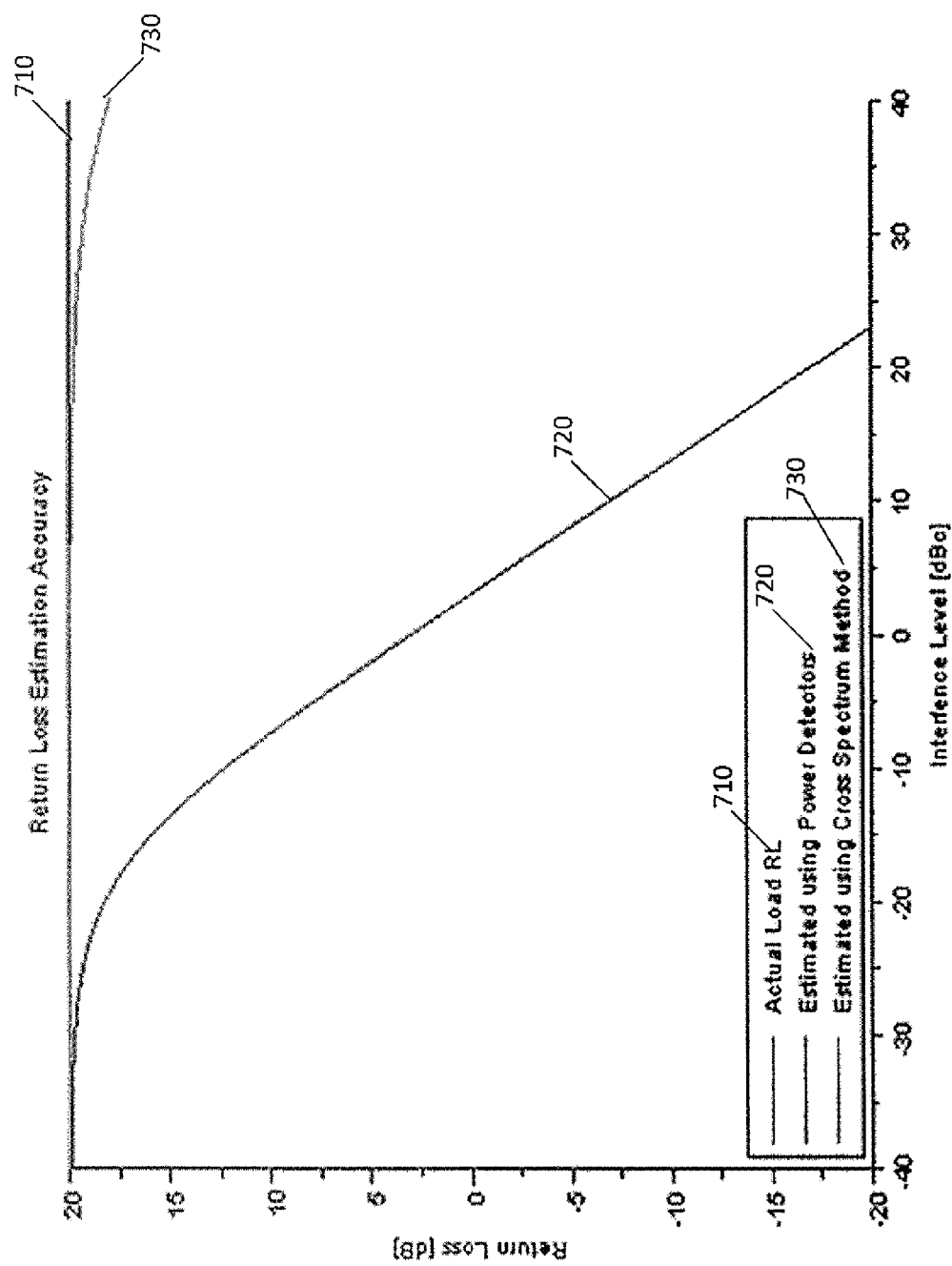
FIG. 7 is a chart illustrating comparisons of non-discriminating and cross-spectrum techniques.

The estimated return loss for this particular signal using both non-discriminating detectors and the cross-spectrum method is shown FIG. 7. The improvement is readily observed. The estimated RL 730 using an exemplary cross-spectrum technique described above is close to the actual load RL 710. Meanwhile, the estimate RL 720 using power detectors diverges quite a bit from the actual load RL 710. This would be the case of using a typical wideband detector (linear or log), a diode detector or even a mixer but with simple averaging (e.g., digital or low pass analog R-C filter) to get the average voltage which represents the average power. As such, the time dependency gets removed. Then calculation of return loss is simply the difference between two such detectors, one for forward power and one for reflected. This is exactly the problem described above in the background section.

Embodiments of the present invention may be implemented in software (executed by one or more processors), hardware (e.g., an application specific integrated circuit), or a combination of software and hardware. In an example embodiment, the software (e.g., application logic, an instruction set) is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted, e.g., in FIG. 1. A computer-readable medium may comprise a computer-readable storage medium (e.g., memory(ies) 155 or other device) that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

The following abbreviations that may be found in the specification and/or the drawing figures are defined as follows:
ADC Analog-to-Digital Converter
ANT Antenna
ASIC Application-Specific Integrated Circuit
CDMA Code Division Multiple Access
CW Continuous Wave
dB decibel
dBc decibels relative to a carrier
DFT Discrete Fourier Transform
eNB evolved Node B (e.g., LTE base station)
FFT Fast-Fourier Transform
IC Integrated Circuit
LTE Long Term Evolution
Msps Megasamples per second
PA Power Amplifier
RF Radio Frequency
RFM Radio Frequency Module, e.g., a radio transceiver unit
RL Return Loss
Rx Reception or Receiver
Tx Transmission or Transmitter
VSWR Voltage Standing Wave Ratio

What is claimed is:

1. A method, comprising;
    determining, by an apparatus, a total forward power using a frequency domain version of a forward signal transmitted over a cable/connector system to one or more antennas;
    determining, by the apparatus, a total reflected power using a frequency domain version of a reflected signal comprising a reflected version of the forward signal;
    determining, by the apparatus, a condition of the cable/connector system using the total forward power and the total reflected power;
    performing a Fourier transform on a sampled version of the forward signal to create the frequency domain version of the forward signal; and
    performing a Fourier transform on a sampled version of the reflected signal to create the frequency domain version of the reflected signal.

2. The method of claim 1, wherein determining the condition further comprises:
    determining an estimated reflection coefficient based on the total forward power and the total reflected power; and
    associating the estimated reflection coefficient with the condition of the cable/connector system.

3. The method of claim 1, wherein:
    determining a total reflected power comprises determining a power of a cross-spectrum at least by multiplying the frequency domain version of the forward signal by the frequency domain version of the reflected signal, wherein the power of the cross-spectrum is an estimate of the total reflected power of the reflected signal; and
    determining a total forward power comprises multiplying the frequency domain version of the forward signal by the frequency domain version of the forward signal.

4. The method of claim 3, wherein:
    the frequency domain version of the reflected signal is a voltage spectrum of the reflected signal; and
    the frequency domain version of the forward signal is a voltage spectrum of the forward signal.

5. The method of claim 3, wherein:
multiplying the frequency domain version of the forward signal with the frequency domain version of the reflected signal performs a complex-valued multiplication; and
multiplying the frequency domain version of the forward signal by the frequency domain version of the forward signal performs a complex-valued multiplication.

6. The method of claim 3, wherein:
multiplying the frequency domain version of the forward signal with the frequency domain version of the reflected signal performs a scalar multiplication; and
multiplying the frequency domain version of the forward signal by the frequency domain version of the forward signal performs a scalar multiplication.

7. The method of claim 1, further comprising sampling a baseband version of the forward signal to determine the sampled version of the forward signal.

8. The method of claim 1, further comprising sampling the cable/connector system in a transmission path or in a reception path of the cable/connector system.

9. The method of claim 1, further comprising:
sampling the cable/connector system at a first sampling rate and beginning at a first time to determine the sampled version of the forward signal; and
sampling the cable/connector system at a second sampling rate and beginning at a second time to determine the sampled version of the reflected signal, wherein the second time is later than the first time.

10. The method of claim 9, wherein the first and the second sampling rates are the same.

11. The method of claim 9, wherein the first and the second sampling rates are different.

12. The method of claim 1, wherein the determining the condition further comprises converting the estimated reflection coefficient to one of a decibel value or a value of a voltage standing wave ratio, each of which is indicative of the condition of the cable/connector system.

13. The method of claim 12, further comprising determining an alarm should occur based on the decibel value or a value of a voltage standing wave ratio and outputting an indication of the alarm.

14. An apparatus, comprising:
at least one processor; and
at least one memory including computer program code, where the at least one memory and the computer program code are configured, with the at least one processor, to cause the apparatus to at least:
determine a total forward power using a frequency domain version of a forward signal transmitted over a cable/connector system to one or more antennas;
determine a total reflected power using a frequency domain version of a reflected signal comprising a reflected version of the forward signal;
determine a condition of the cable/connector system using the total forward power and the total reflected power;
perform a Fourier transform on a sampled version of the forward signal to create the frequency domain version of the forward signal; and
perform a Fourier transform on a sampled version of the reflected signal to create the frequency domain version of the reflected signal.

15. An apparatus, comprising:
at least one processor; and
at least one memory including computer program code, where the at least one memory and the computer program code are configured, with the at least one processor, to cause the apparatus to at least:
determine a total forward power using a frequency domain version of a forward signal transmitted over a cable/connector system to one or more antennas;
determine a total reflected power using a frequency domain version of a reflected signal comprising a reflected version of the forward signal; and
determine a condition of the cable/connector system using the total forward power and the total reflected power, wherein
determining the total reflected power comprises determining a power of a cross-spectrum at least by multiplying the frequency domain version of the forward signal by the frequency domain version of the reflected signal, wherein the power of the cross-spectrum is an estimate of the total reflected power of the reflected signal; and
determining the total forward power comprises multiplying the frequency domain version of the forward signal by the frequency domain version of the forward signal.

16. The apparatus of claim 15, wherein determining the condition further comprises:
determining an estimated reflection coefficient based on the total forward power and the total reflected power; and
associating the estimated reflection coefficient with the condition of the cable/connector system.

17. The apparatus of claim 15, wherein:
the frequency domain version of the reflected signal is a voltage spectrum of the reflected signal; and
the frequency domain version of the forward signal is a voltage spectrum of the forward signal.

18. The apparatus of claim 15, wherein:
multiplying the frequency domain version of the forward signal with the frequency domain version of the reflected signal performs a complex-valued multiplication; and
multiplying the frequency domain version of the forward signal by the frequency domain version of the forward signal performs a complex-valued multiplication.

19. The apparatus of claim 15, wherein the at least one memory including the computer program code is configured with the at least one processor to cause the apparatus to:
perform a Fourier transform on a sampled version of the forward signal to create the frequency domain version of the forward signal; and
perform a Fourier transform on a sampled version of the reflected signal to create the frequency domain version of the reflected signal.

20. The apparatus of claim 19, wherein the at least one memory including the computer program code is configured with the at least one processor to cause the apparatus to:
sample a baseband version of the forward signal to determine the sampled version of the forward signal.

21. A method, comprising;
determining, by an apparatus, a total forward power using a frequency domain version of a forward signal transmitted over a cable/connector system to one or more antennas;
determining, by the apparatus, a total reflected power using a frequency domain version of a reflected signal comprising a reflected version of the forward signal; and
determining, by the apparatus, a condition of the cable/connector system using the total forward power and the total reflected power, wherein determining a total reflected power comprises determining a power of a cross-spectrum at least by multiplying the frequency domain version of the forward signal by the frequency domain version of the reflected signal, wherein the power of the cross-spectrum is an estimate of the total reflected power of the reflected signal; and determining a total forward power comprises multiplying the frequency domain version of the forward signal by the frequency domain version of the forward signal.

* * * * *